(12) United States Patent
Lanzerstorfer et al.

(10) Patent No.: US 7,535,055 B2
(45) Date of Patent: May 19, 2009

(54) TRENCH TRANSISTOR

(75) Inventors: Sven Lanzerstorfer, Feldkirchen (AT); Dietmar Kotz, Moosburg (AT); Hermann Peri, Wernberg (AT); Norbert Krischke, Munich (DE)

(73) Assignee: Infineon Technologies Austria AG, Villach (AT)

(*) Notice: Subject to any disclaimer, the term of this patent is extended or adjusted under 35 U.S.C. 154(b) by 59 days.

(21) Appl. No.: 11/769,882

(22) Filed: Jun. 28, 2007

(65) Prior Publication Data

US 2008/0001216 A1 Jan. 3, 2008

(30) Foreign Application Priority Data

Jun. 28, 2006 (DE) .................. 10 2006 029 750

(51) Int. Cl.
- H01L 29/76 (2006.01)
- H01L 29/94 (2006.01)
- H01L 31/062 (2006.01)
- H01L 31/113 (2006.01)
- H01L 31/119 (2006.01)

(52) U.S. Cl. .............. 257/330; 257/331; 257/E27.091

(58) Field of Classification Search .......... 257/328, 257/330, 331, 333, E27.091
See application file for complete search history.

(56) References Cited

U.S. PATENT DOCUMENTS

| 6,548,860 B1 | 4/2003 | Hshieh et al. |
| 6,921,939 B2 * | 7/2005 | Zeng .................. 257/330 |
| 2003/0047776 A1 | 3/2003 | Hueting et al. |
| 2006/0017100 A1 | 1/2006 | Bol et al. |

FOREIGN PATENT DOCUMENTS

| DE | 10127885 | 12/2002 |
| DE | 10212149 | 10/2003 |
| DE | 10350684 | 6/2005 |
| JP | 2004055976 | 2/2004 |

* cited by examiner

Primary Examiner—Hoai V. Pham
(74) Attorney, Agent, or Firm—Dicke, Billig & Czaja, PLLC

(57) ABSTRACT

A trench transistor is disclosed. One embodiment has an active zone enclosed by an edge trench, wherein an edge electrode at gate potential is embedded into the edge trench, and the active zone has a mesa structure at least partly adjoining the edge trench. That region of the mesa structure which adjoins the edge trench is at least partly electrically deactivated by virtue of the fact that within this deactivated region a) the mesa structure is covered with a mesa insulation layer, and b) no source zone is provided.

13 Claims, 5 Drawing Sheets

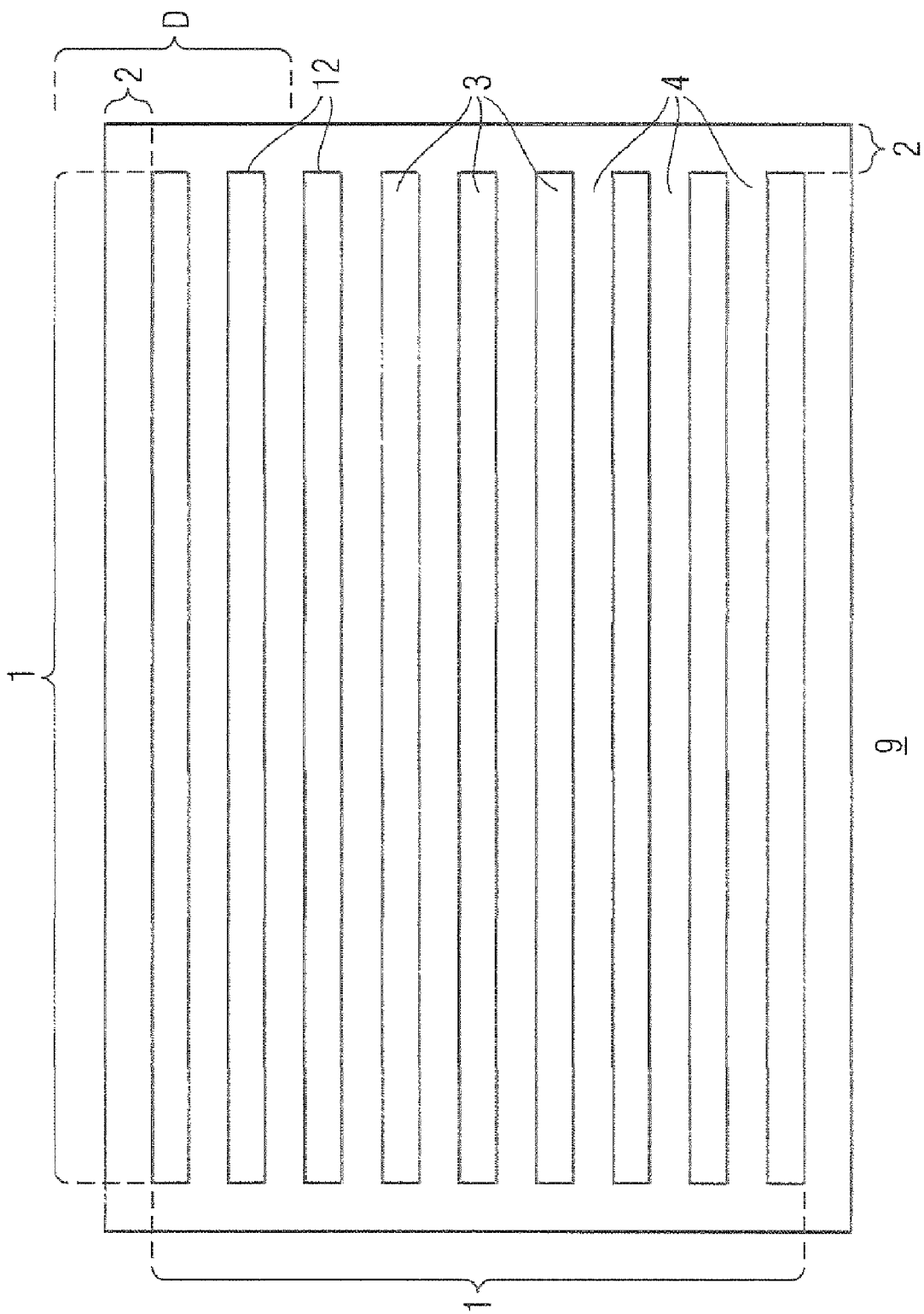

TRENCH TRANSISTOR

CROSS-REFERENCE TO RELATED APPLICATIONS

This Utility Patent Application claims priority to German Patent Application No. DE 10 2006 029 750.4 filed on Jun. 28, 2006, which is incorporated herein by reference.

BACKGROUND

The invention relates to a trench transistor having an active zone enclosed by an edge trench, wherein an edge electrode at gate potential is embedded into the edge trench, and the active zone has a mesa structure at least partly adjoining the edge trench. The invention furthermore relates to a method for producing a trench transistor of this type.

Trench transistors of the type referred to above are also referred to as trench transistors having a "closed design". FIG. 1 illustrates a basic schematic diagram of a possible embodiment of a trench transistor having a closed design (plan view). The illustration illustrates an active zone 1 of a trench transistor, enclosed by an edge trench 2. The active zone 1 has a mesa structure, which in this case includes a plurality of mesa strips 3 arranged parallel to one another. The mesa strips 3 are separated from one another by gate trenches 4.

FIG. 2a illustrates a perspective illustration of the region identified by "D" in FIG. 1. The illustration additionally illustrates a part of an edge termination 5 which at least partly surrounds the active zone (to put it more precisely the edge trench 2). The edge termination 5 includes a plurality of mesa strips (oxide edge) 3' which are coated with an insulation layer (field oxide layer) and are separated from one another by edge termination trenches 6.

FIG. 2a illustrates a process stage of the trench transistor before a field electrode structure composed of a plurality of field electrodes 7 insulated from the semiconductor body 9 by using a field oxide layer 8 (see FIG. 2b) is embedded within the trench structure (including edge trench 2 and gate trenches 4). The field oxide layer 8 is produced by oxidation of the entire semiconductor body 9 and subsequent etching back of the oxide layer thus produced into the trench structure. The free spaces remaining between the field oxide layer regions are filled with electrically conductive material (e.g., polysilicon) in order to produce the field electrodes 7. The semiconductor body 9 (at least the mesa structure) is then oxidized anew in order to produce a gate oxide layer 10, free spaces that remain between the gate oxide layer regions being filled with electrically conductive material (e.g., polysilicon) in order to produce a gate electrode structure composed of a plurality of gate electrodes 11. Afterward or before the formation of the gate oxide layer 10, source zones S and body zones B are produced within the mesa strips 3, the zones reaching to the end sides 12 of the mesa strips 3. The trench transistor outlined schematically in FIG. 2B is thus produced (FIG. 2b illustrates a reduced cross-sectional illustration of the trench transistor illustrated in FIG. 2a along the sectional line A, but in FIG. 2a the trench fillings have been omitted in order to better illustrate the individual trenches).

With the trench transistor illustrated in FIG. 2b, at the end sides 12 on account of the gate electrode 11 provided within the edge trench 2 and on account of the source and body zones S, B reaching to the end sides 12 of the mesa strips 3, channels can be produced within the body zone B, that is to say that at the end sides electric currents are induced between the source zone S and the semiconductor body 9 if the gate electrode 11 is at gate potential together with the gate electrodes 11 provided within the gate trenches 4. The electric currents at the end sides 12 are undesirable, however.

In order to avoid the electric currents at the end sides 12 it is known, for example, for the source zones S not to be permitted to reach to the end sides 12, but rather for only body zones B to be formed in those regions of the mesa strips 3 which adjoin the end sides 12. For this purpose, in the prior art, a dedicated source photomask is used for example during the production of the source zones.

In this case, however, the production of the source zones S thereby becomes unnecessarily complicated.

SUMMARY

One embodiment of the invention relates to a trench transistor. One embodiment has an active zone enclosed by an edge trench, wherein an edge electrode at gate potential is embedded into the edge trench, and the active zone has a mesa structure at least partly adjoining the edge trench. That region of the mesa structure which adjoins the edge trench is at least partly electrically deactivated by virtue of the fact that within this deactivated region a) the mesa structure is covered with a mesa insulation layer, and b) no source zone is provided.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 illustrates a basic schematic diagram of a plan view of a trench transistor in accordance with the prior art.

DETAILED DESCRIPTION

Figure 2A:
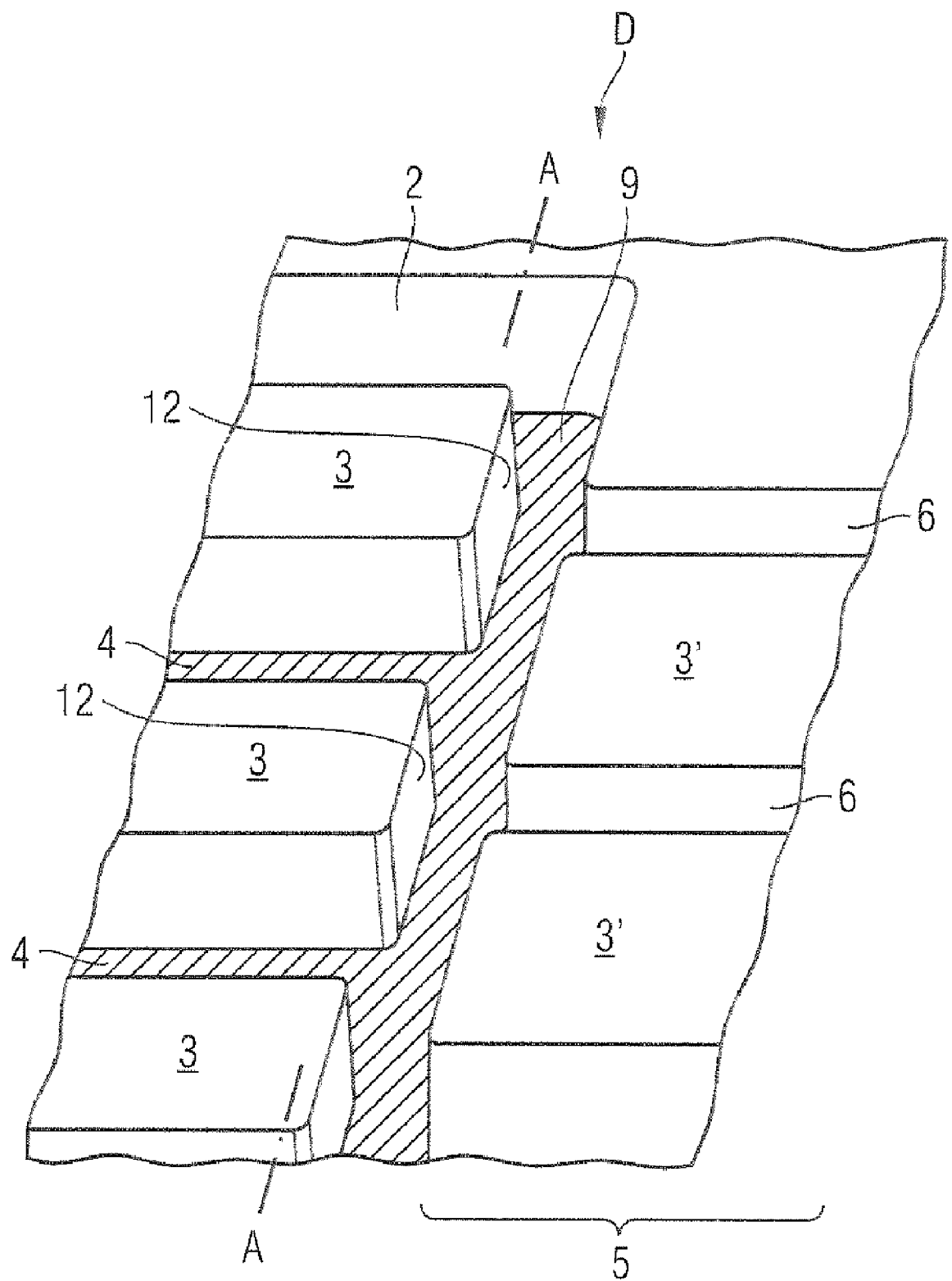
FIG. 2a illustrates a perspective view of an excerpt from the trench transistor illustrated in FIG. 1.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One aspect of the invention specifies a trench transistor and also a production method suitable therefor in which the problems set out above with regard to the leakage currents at the end sides of the mesa strips can be avoided, but on the other hand simple production of the trench transistor is made possible.

The trench transistor according to one embodiment has an active zone enclosed by an edge trench, wherein an edge electrode at gate potential is embedded into the edge trench, and the active zone has a mesa structure at least partly adjoining the edge trench. That region of the mesa structure which adjoins the edge trench is at least partly electrically deactivated by virtue of the fact that within the deactivated region a) the mesa structure is covered with a mesa insulation layer, and b) no source zone is provided.

One aspect of the trench transistor according to one embodiment is that the mesa insulation layer can simultaneously be used as a photomask for producing the source zones, that is to say that a dedicated source photomask for omitting the source zones in the region of the mesa structure which adjoins the edge trench is not required.

In one embodiment, the mesa insulation layer is produced together with the field electrode insulation layer, which serves for insulating a field electrode structure embedded into the edge trenches and/or into the gate trenches from the mesa structure, in one process (that is to say that the mesa insulation layer is part of the field electrode insulation layer). One aspect in this case is that a mask is used anyway for producing the field electrode insulation layer (in particular during the process of etching back the latter into the trench structure), which mask, according to the invention, simultaneously serves for producing the mesa insulation layer. In other words: the mask required for producing the field electrode insulation layer is designed in such a way that the deactivated region of the mesa structure is not freed of the field electrode insulation layer, rather a residue of the field electrode insulation layer remains as mesa insulation layer on the deactivated region.

The mesa insulation layer and the field electrode insulation layer can be produced for example by oxidation of the mesa structure.

The mesa structure can be configured as desired. By way of example, it is possible to design the mesa structure in the form of a plurality of strip-type mesa zones whose end sides adjoin the edge trench. In this case, the mesa insulation layer should cover the end sides and also those regions of the longitudinal sides and of the top sides of the mesa zones which adjoin the end sides. No source zones should be formed below that region of the mesa insulation layer which covers the top sides of the mesa zones. Body zones can be formed below that region of the mesa insulation layer which covers the top sides of the mesa zones, the body zones in each case reaching as far as the end sides of the mesa zones (in order to avoid the "punch-through effect"). The lateral extent of the mesa insulation layer, proceeding from one end side of a mesa zone in the direction of the respective other end side of the mesa zone, should lie within a range of between 0.1 μm and 2 μm. However, the invention is not restricted to the range.

One embodiment furthermore provides a method for producing a trench transistor, proceeding from a semiconductor body, in which are provided:
  an active zone enclosed by an edge trench,
  a mesa structure provided within the active zone and at least partly adjoining the edge trench,
  featuring the following steps of:
  producing an insulation layer covering the mesa structure,
  etching back the insulation layer into the edge trench and/or into a gate trench structure pervading/bordering the mesa structure, wherein the residues of the insulation layer which remain in the edge region and in the gate trench structure serve for insulating a field electrode structure that is to be introduced into the trenches from the semiconductor body, and wherein the etching back is effected in such a way that that region of the mesa structure which adjoins the edge trench is at least partly covered by the insulation layer,
  forming body zones and source zones in the mesa structure using the insulation layer as a mask.

The insulation layer can be produced for example by oxidation of the mesa structure.

The mesa structure can have a plurality of strip-type mesa zones whose end sides adjoin the edge trench. In this case, the etching back should be effected in such a way that the insulation layer, after the etching back, covers the end sides and also those regions of the longitudinal sides and of the top sides of the mesa zones which adjoin the end sides. Body zones can be formed below that region of the insulation layer which covers the top sides of the mesa zones, the body zones in each case reaching as far as the end sides of the mesa zones, by virtue of the fact that dopants of a first conduction type are introduced into the mesa structure using the insulation layer as a mask, and a heat treatment process is subsequently performed, which has the effect that the dopants introduced diffuse as far as the respective end sides. Source zones should be formed below that region of the insulation layer which covers the top sides of the mesa zones, the source zones not reaching as far as the end sides of the mesa zones, by virtue of the fact that dopants of a second conduction type are introduced into the mesa structure using the insulation layer as a mask. The lateral extent of the mesa insulation layer can for example be chosen, and the introduction of the dopants of the second conduction type can be effected, such that the lateral distance between the source zones and the end sides lies within a range of between 0.1 μm and 2 μm.

In one embodiment, the first doping type is the p doping type and the second doping type is the n doping type. In this case, the doping type of the semiconductor body is the second doping type.

Figure 3A:
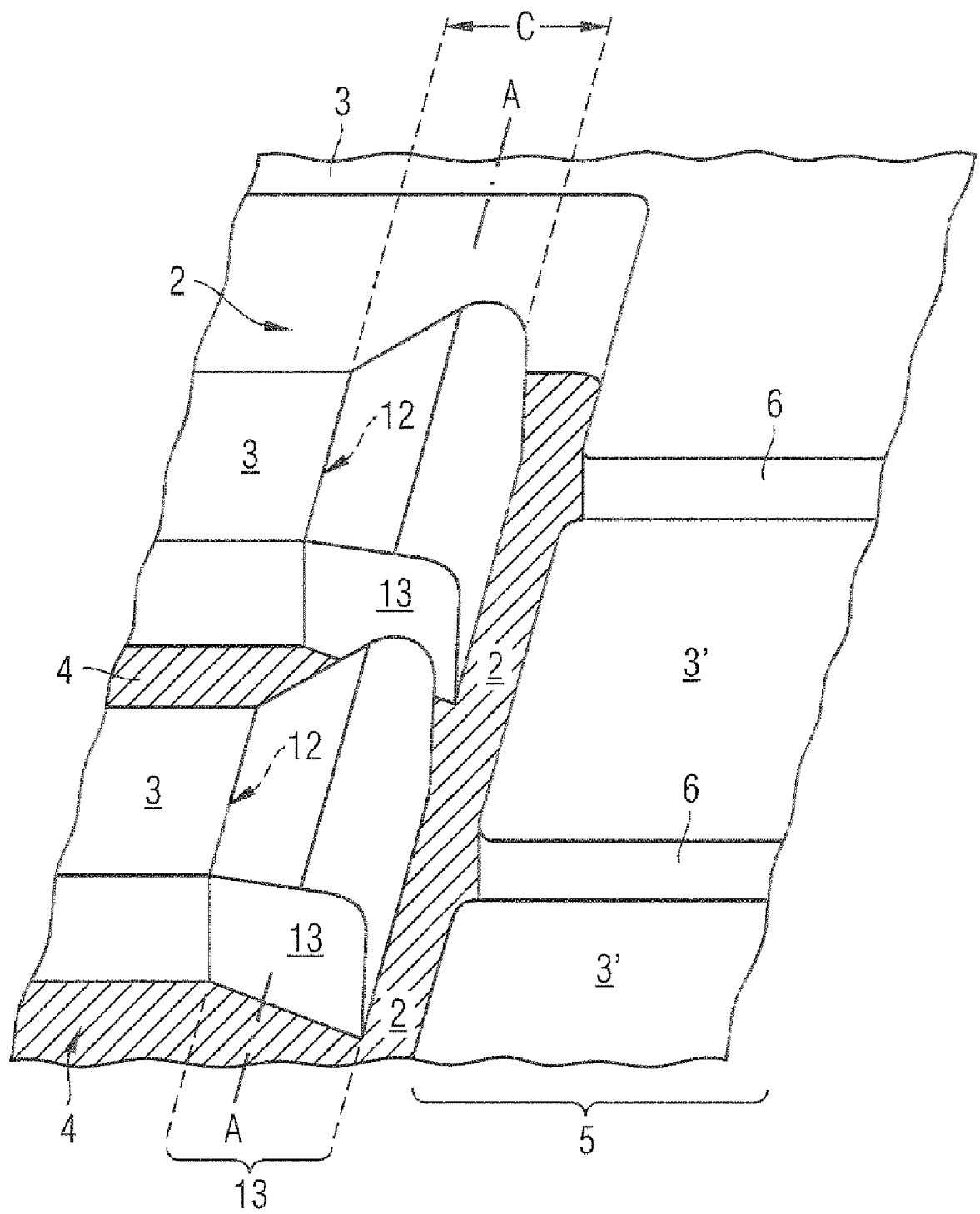
FIG. 3a illustrates a perspective illustration of a possible embodiment of the trench transistor according to the invention.

FIG. 3a illustrates an excerpt from a trench transistor according to one embodiment in perspective view. The process stage of the trench transistor illustrated in FIG. 3a corresponds to that of the trench transistor illustrated in FIG. 2a, but with the difference that the field oxide layer 8 has not been etched back completely into the trench structure, but rather has been etched back in such a way that the end sides 12 and also those regions of the mesa strips 3 which adjoin the end sides 12 are covered by a field oxide layer residue as a mesa insulation layer 13.

Figure 2B:
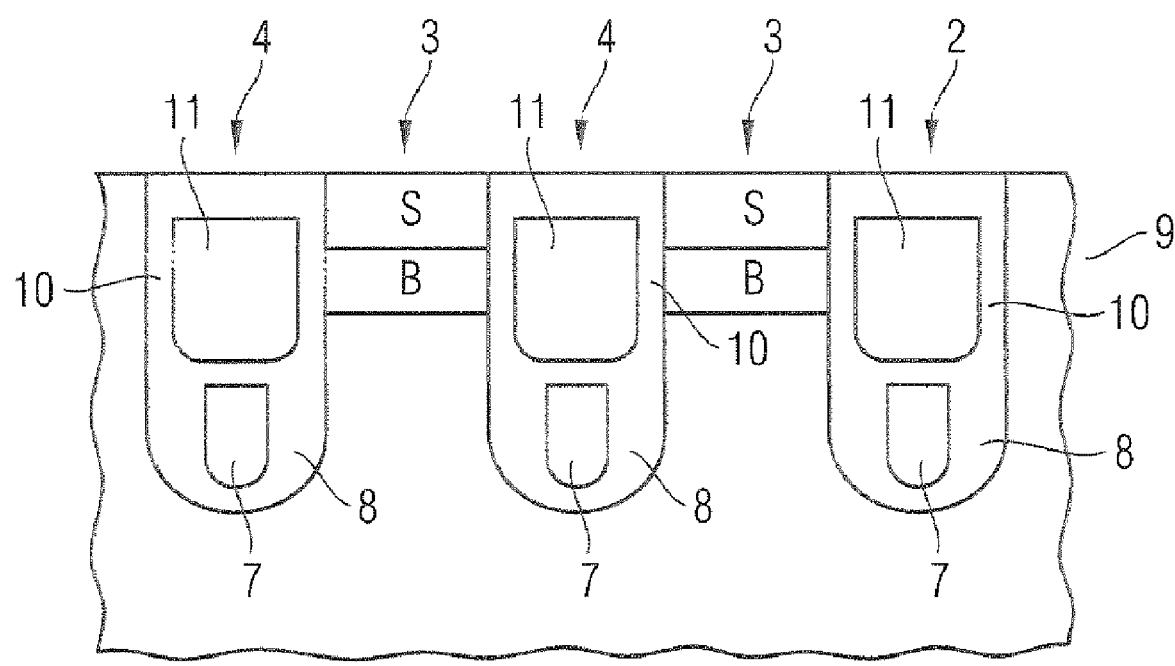
FIG. 2b illustrates a sectional illustration of the trench transistor illustrated in FIG. 2a along the sectional line A with "filled" trenches.
Figure 3B:
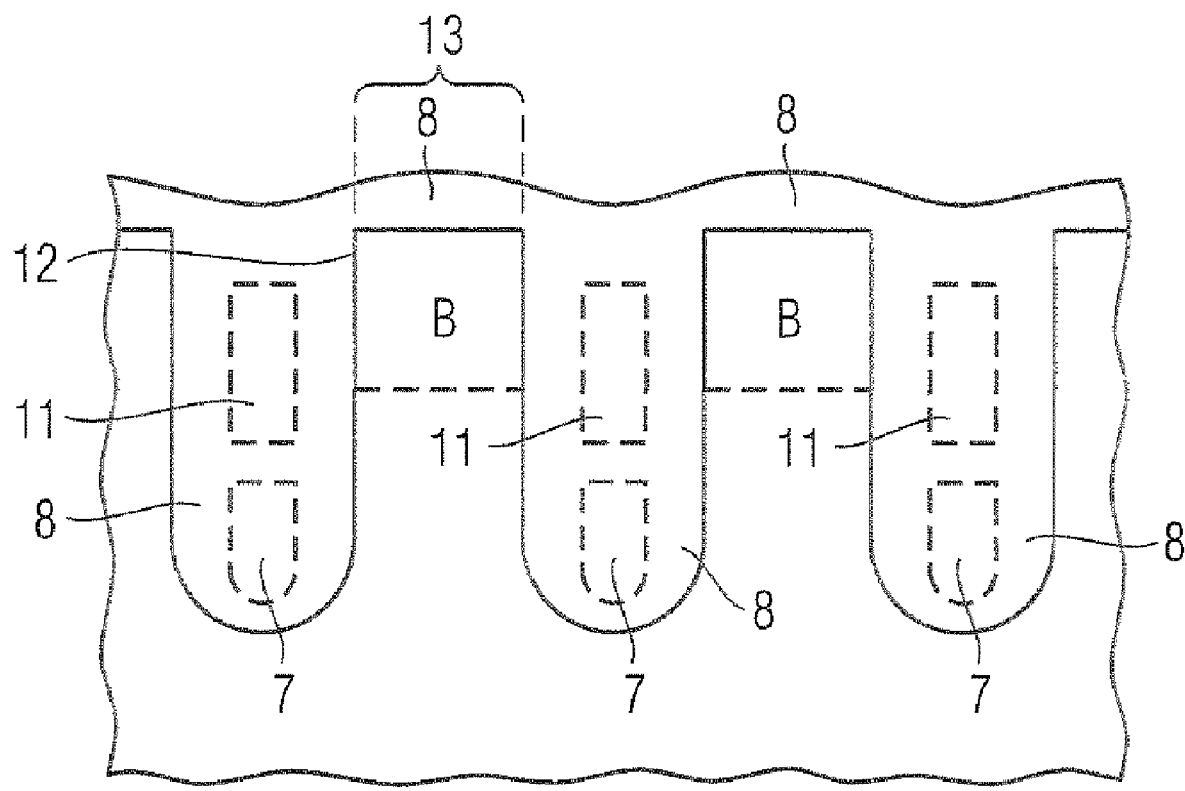
FIG. 3b illustrates a sectional illustration of the trench transistor illustrated in FIG. 3a along the sectional line A with "filled" trenches.

FIG. 3b illustrates a reduced cross-sectional illustration of the trench transistor illustrated in FIG. 3a, but as in FIG. 2b the trench fillings have additionally been introduced, the trench fillings being omitted in FIG. 3a as in FIG. 2a in order to simplify the illustration. Moreover, in FIG. 3a the parts lying in the plane behind the insulation layer 13 are represented in dashed lines in order to illustrate them. The difference from the embodiments illustrated in FIG. 2b is that those regions of the surfaces which adjoin the end sides 12 and also corresponding lateral areas of the mesa strips 3 are not uncovered (FIG. 2b), but rather are covered with a field oxide layer residue (mesa insulation layer 13). Furthermore, no source zones S but rather only body zones B are formed at the end side 12: according to one embodiment, the mesa insulation layer 13 is used as a mask for producing the source zones S, with the result that the lateral extent of the source zones S does not reach to the end sides 12 (preferably, no heat treatment process is effected). In contrast to this, in order to produce the body zone after introduction of corresponding dopants into the mesa strips 3, a heat treatment process is carried out which is designed such that the dopants introduced diffuse to the end sides 12 and the body zones B illustrated in FIG. 3b consequently arise.

The lateral extent C of the mesa insulation layer 13 should be constituted such that the source zones produced using the mesa insulation layer 13 have a lateral distance of 0.1 μm to 2 μm from the end sides 12.

Further aspects of the invention will be explained in more detail in the description below.

An aim of one embodiment is to avoid increased leakage currents, shoulders in the input characteristic curve, and also to improve the avalanche strength and the failure distribution in gate oxide tests (SSQ, E-const, HTGS) of trench power transistors.

In trench power transistors having a closed design (use of an edge trench), a gate oxide region is also present at the mesa end sides and in particular around the corners of the mesa. Since a dedicated mask is not usually used during the production of the source zones, the source zones extend as far as the end side of the mesa, whereby the latter and the vertical edges thereof constitute active channel zones. Depending on the saturation of the interface $SiO_2$, a leakage current can thereby flow below the threshold voltage, whereby a shoulder arises in the input characteristic curve.

In order to avoid these effects, it is e.g., known to omit the source implantation at the corners by using dedicated phototechnology. The document JP2004-055976-A discloses producing $p^+$-doped zones at the corners in order to deactivate the corners. It has also been recognized that the avalanche strength of systems without mesa end side shading during the source implantation is lower than in comparable transistors with shading. Melting in the region of the mesa end sides could be observed.

According to one embodiment, the mesa end sides of the trench transistors are configured in inactive fashion. This means, in particular, that neither gate oxide or source zones are present in the region of the mesa end sides. One aspect of the embodiment is that dedicated phototechnology does not have to be introduced for this. The covering of that region of the mesa structure which adjoins the edge trench with field oxide (mesa insulation layer) and also the positioning of the edge position of the mesa insulation layer on the mesa structure should be configured such that, as a result of the body diffusion, a sufficiently doped p-type zone arises as far as the mesa end side, with the result that no "punch-through" occurs, and, on the other hand, the source zones are far enough away from the end sides.

Accordingly, one aspect of one embodiment consists in covering the mesa end sides of trench power transistors with field oxide, such that these regions become electrically inactive.

By way of example, the field oxide edge may have a distance within the range of between 0.1 μm and 2.0 μm toward the mesa end side. As a result, depending on the process implementation, the dielectric strength of the component is ensured and, at the same time, the mesa end side is electrically deactivated.

FIG. 2a illustrates the prior art with active mesa end sides (after the field oxide etching). The entire mesa is subsequently enclosed with gate oxide.

FIG. 3a illustrates the structure according to one embodiment with inactive mesa end sides as a result of covering with field oxide across the mesa edges (direction of cell array).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A trench transistor comprising:
   an active zone enclosed by an edge trench;
   an edge electrode at gate potential embedded into the edge trench; and
   a mesa structure in the active zone at least partly adjoining the edge trench;
   wherein that region of the mesa structure that adjoins the edge trench is at least partly electrically deactivated by virtue of the fact that within the deactivated region the mesa structure is covered with a mesa insulation layer, and no source zone is provided.

2. A trench transistor of claim 1, wherein the mesa insulation layer is produced together with a field electrode insulation layer, which serves for insulating a field electrode structure embedded into the edge trenches and/or into the gate trenches from the mesa structure, in one process.

3. The trench transistor of claim 1, wherein the mesa insulation layer and the field electrode insulation layer are produced by oxidation of the mesa structure.

4. The trench transistor of claim 1, wherein the mesa structure has a plurality of strip-type mesa zones whose end sides adjoin the edge trench.

5. The trench transistor of claim 4, wherein the mesa insulation layer covers the end sides and also those regions of the longitudinal sides and of the top sides of the mesa zones which adjoin the end sides.

6. The trench transistor of claim 5, wherein no source zones are formed below that region of the mesa insulation layer which covers the top sides of the mesa zones.

7. The trench transistor of claim 5, wherein body zones are formed below that region of the mesa insulation layer which covers the top sides of the mesa zones, the body zones in each case reaching as far as the end sides of the mesa zones.

8. The trench transistor claim 5, wherein the lateral extent of the mesa insulation layer, proceeding from one end side of a mesa zone in the direction of the respective other end side of the mesa zone, lies within a range of between 0.1 μm and 2 μm.

9. A trench transistor comprising:
   an active zone enclosed by an edge trench;
   an edge electrode at gate potential embedded into the edge trench;
   a mesa structure in the active zone at least partially adjoining the edge trench, and
   insulating means covering the mesa structure for deactivating the region of the mesa structure that adjoins the edge trench.

10. The trench transistor of claim 9, wherein no source zone is provided such that the region of the mesa structure that adjoins the edge trench is deactivated.

11. The trench transistor of claim 9, wherein the insulation means comprises a mesa insulation layer.

12. The trench transistor of claim 11, wherein the mesa insulation layer is produced together with a field electrode insulation layer, which serves for insulating a field electrode structure embedded into the edge trenches and/or into the gate trenches from the mesa structure, in one process.

13. The trench transistor of claim 11, wherein the mesa insulation layer and the field electrode insulation layer are produced by oxidation of the mesa structure.

\* \* \* \* \*